(12) United States Patent
Bankman et al.

(10) Patent No.: US 9,467,310 B2
(45) Date of Patent: Oct. 11, 2016

(54) WIDE COMMON-MODE RANGE RECEIVER

(75) Inventors: Jesse Bankman, Gibsonville, NC (US);
Quanli Lu, Kernersville, NC (US);
Kimo Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/457,213

(22) Filed: Apr. 26, 2012

(65) Prior Publication Data

US 2013/0287084 A1 Oct. 31, 2013

(51) Int. Cl.
*H04L 25/02* (2006.01)
*H03F 3/45* (2006.01)
*H03F 3/50* (2006.01)
*H04L 25/03* (2006.01)

(52) U.S. Cl.
CPC ....... *H04L 25/0274* (2013.01); *H03F 3/45076* (2013.01); *H03F 3/50* (2013.01); *H04L 25/0296* (2013.01); *H03F 2200/294* (2013.01); *H03F 2200/453* (2013.01); *H03F 2203/45306* (2013.01); *H04L 25/03878* (2013.01)

(58) Field of Classification Search
CPC . H04L 25/0276; H04L 25/0294; H03H 7/40; H03K 9/00; H04B 5/0012
USPC .................................................. 375/316, 229
See application file for complete search history.

(56) References Cited

U.S. PATENT DOCUMENTS

| | | | |
|---|---|---|---|
| 4,668,919 A * | 5/1987 | de Weck | 330/253 |
| 5,126,586 A | 6/1992 | Gilbert | |
| 5,424,657 A * | 6/1995 | Van Brunt et al. | 326/63 |
| 6,768,352 B1* | 7/2004 | Maher et al. | 327/112 |
| 2004/0232945 A1* | 11/2004 | Tseng | 326/68 |
| 2006/0145751 A1* | 7/2006 | Gangasani et al. | 327/543 |
| 2006/0152282 A1* | 7/2006 | Halbert et al. | 330/256 |
| 2008/0018389 A1* | 1/2008 | Kim et al. | 327/544 |
| 2012/0074987 A1* | 3/2012 | Piepenstock et al. | 327/108 |

OTHER PUBLICATIONS

Analog Devices, AD8158 Data Sheet: Quad Buffer Mux/Demux, Dec. 2009, 36 pages.

\* cited by examiner

*Primary Examiner* — Kevin M Burd
(74) *Attorney, Agent, or Firm* — Knobbe, Martens, Olson & Bear, LLP

(57) ABSTRACT

A wide common-mode range receiver includes an input module, voltage level shift module, voltage level shift control module, and output module. The receiver can also include an equalizer. The receiver translates data originating from a circuit powered from an external voltage supply to a circuit powered by an internal voltage supply. The voltage level shift may be scaled based on differences between the voltage supplies or by determining the difference between an input common-mode voltage and a reference voltage, and driving a servo based on the difference.

20 Claims, 6 Drawing Sheets

WIDE COMMON-MODE RANGE RECEIVER

BACKGROUND

1. Field of the Invention

Embodiments of the invention generally relate to electronics, and in particular, to communications circuits.

2. Description of Related Art

Receivers for wire-line applications often must accommodate a wide range of common-mode operating voltages when interfacing the receiver of one integrated circuit (IC) to the transmitter of a possibly different IC. Often, AC-coupling or capacitive coupling implemented with capacitors is used to accommodate differences in the input and output common-mode levels of the receiver and transmitter of the link. These AC-coupling capacitors take board space. In addition, AC-coupling capacitors can restrict the maximum run length of consecutive identical symbols in a transmitted pattern because they have a minimum cutoff frequency below which transmission is blocked. Furthermore, the AC-coupling capacitors can store DC by accumulating charge. Thus, a DC-imbalance in the transmitted signal can be stored on the capacitors and can interfere with the operation of the receiver. A receiver front-end circuit that may be DC-coupled and which is compatible with a wide-input common-mode range is therefore desirable.

For applications involving the transmission of multi-gigabit per second rate NRZ data, there are a multitude of standards which encompass a wide range of required input and output common-mode levels. Some of these standards specify DC-coupled receiver operation and do not allow the use of AC-coupling capacitors.

Finally, in many applications using AC-coupling, because of limitations posed by device biasing requirements of standard receiver analog front end (AFE) circuits, the required receiver input common-mode level is lower than the IC supply voltage. To accommodate this requirement, an additional 'input termination' supply is often explicitly called for or is generated internally.

SUMMARY

An electrical circuit, or apparatus, is described that include a first input circuit configured to receive a first input signal, a second input circuit configured to receive a second input signal, wherein the first and second input signals are associated with a first common-mode voltage, a first switching element operatively coupled with a voltage source and the first input circuit, a second switching element operatively coupled with the voltage source, the second input circuit, and the first switching element, a first current source operatively coupled to the first switching element, a second current source operatively coupled to the second switching element and the first current source, a first control input circuit, a second control input circuit, one or more control switching elements operatively coupled to the first control input circuit, the second control circuit input, the first switching element, and the second switching element, a cascode circuit operatively coupled to the one or more control switching elements, a current mirror operatively coupled to the cascode circuit, and a control current source operatively coupled to the current mirror, the first current source, and the second current source. The first switching element is configured to output a first output signal and the second switching element is configured to output a second output signal. The first and second output signal are associated with a second common-mode voltage.

In some embodiments, an electrical circuit, or apparatus, is described that includes first and second input circuits, a first node operatively coupled to the first input circuit, a first switching element, and a first current source, a second node operatively coupled to the second input circuit, a second switching element, and a second current source, a third node operatively coupled to the first switching element, the second switching element, and one or more control switching elements, a first control node coupled to first and second control input circuits, the one or more control switching elements, and a control current source, a second control node coupled to the one or more control switching elements and a cascode circuit, a third control node coupled to the cascode circuit, a current mirror, the control current source, the first current source, and the second current source, a first output node coupled to the first switching element, and a second output node coupled to the second switching element.

In certain embodiments, an electrical circuit, or apparatus, is described that includes an input circuit configured to receive at least a first input signal and a second input signal and to provide a first signal associated with the first input signal at a first node and a second signal associated with the second input signal at a second node, a voltage level shift module having a first input operatively coupled to the first node and a second input operatively coupled to the second node, wherein the voltage level shift module is configured to generate a first output signal that is level shifted from the first input signal and a second output signal that is level shifted from the second input signal, a first current source having an output operatively coupled to the first node, wherein the first current source is configured to receive a control signal for control of a first current through the first node, a second current source having an output operatively coupled to the second node, wherein the second current source is configured to receive the control signal for control of a second current through the second node, and a voltage level shift control module. The voltage level shift control module includes a control input circuit configured to receive the at least two input signals, a control current source, and a replica control module of the control input circuit. The replica control module is configured to generate the control signal for the control current source, the first current source and the second current source.

DETAILED DESCRIPTION

An electronic circuit is presented that translates data from an external $V_{TT}$ supply domain to an internal $V_{CC}$ supply domain. The level shift is accomplished by producing a DC voltage across an input V-to-I network. The DC voltage may be scaled according to the difference between the supplies or by determining the difference between an input common-mode voltage and a reference voltage, and driving a servo with the difference.

Figure 1:
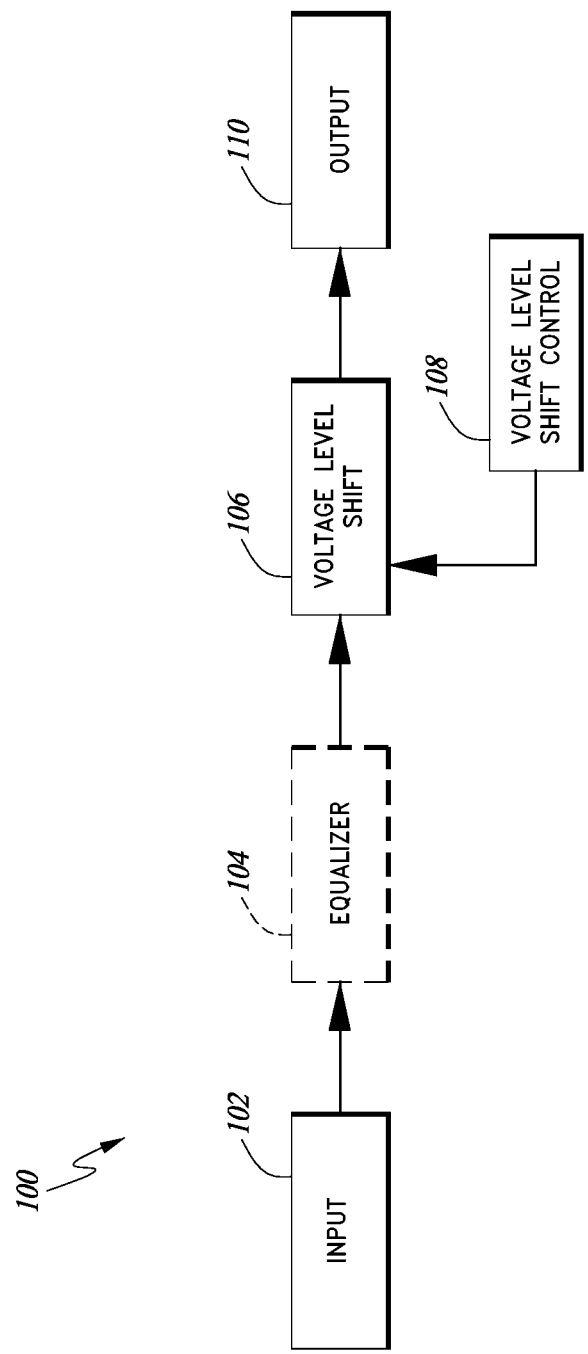
FIG. 1 is a block diagram illustrating an embodiment of a common-mode range tolerant receiver.

FIG. 1 is a block diagram illustrating an embodiment of a common-mode range tolerant receiver. The illustrated embodiment includes an input module 102, equalizer module 104, voltage level shift (VLS) module 106, VLS control module 108, and an output module 110.

The input module 102 can be configured to receive single-ended or a differential (pair) signal. The differential signals can include a differential component and a common-mode voltage. The input module 102 can further include a termination voltage, one or more termination resistors, and one or more input resistors. As previously mentioned, the common-mode voltage received at the input module 102 may be different than the common-mode voltage of the integrated circuit that includes the receiver 100.

The equalizer 104 includes circuit components that reduce the interference on a signal and improve the signal quality, and in some embodiments can be included as part of the receiver 100. The equalizer 104 can be located in a number of different locations within the receiver 100. For example, the equalizer 104 can form part of the input module 102, VLS module 106, or output module 110. In some embodiments, the equalizer module 104 can be located between the voltage level shift module 106 and the output module 110. In certain embodiments, the equalizer 104 is located after the output module 110. The equalizer module can be a passive and/or active equalizer and can be implemented using a variety of electronic components, such as capacitors, resistors, operational amplifiers (op-amps), transistors, and the like. In some embodiments, the equalizer is implemented using a capacitor in parallel with a resistor.

The VLS module 106 receives the single-ended or differential signals from the input module 102 or equalizer 104 and includes circuit components that shift the common-mode voltage of the signals received at the input module 102 to the common-mode voltage of the IC. The voltage level shift can be either up or down depending on the common-mode voltage of the signals and the common-mode voltage of the IC. The voltage level shift can be accomplished based on the difference between the external voltage supply $V_{TT}$ and the internal voltage supply $V_{CC}$, or by monitoring the difference between an input common-mode voltage and a reference voltage. In some embodiments, the VLS module 106 can include one or more resistors, transistors, such as BJTs, FETS, MOS devices, such as MOSFETS, current sources, diodes or Zener diodes, or other methods to generate a fixed, dc-offset across a resistive or other network. For example, in some embodiments, the current sources can be implemented using one or more transistors, such as bi-polar junction transistors (BJT), field-effect transistors (FET), metal-oxide semiconductor (MOS) devices, etc. In some embodiments the MOS devices do not use metal or an oxide. For example, a polymer can be used for the gate and other dielectrics can be used as an insulating layer below the gate. In some embodiments, the VLS module 106 can further include voltage biasing circuits to increase the stability of the circuit and one or more bias currents in order to maintain the transistors in an operational state. In certain embodiments, the VLS module can be implemented using a switched regulator or a linear regulator on chip that allows scaling the termination supply voltage and switching between multiple receiver structures.

The VLS control module 108 includes one or more circuit components that are used to determine the amount of voltage shift that occurs in the VLS module 106, as will be discussed in greater detail with reference to FIG. 2.

The output module 110 includes the single-ended or differential pair signals after they have been shifted by the VLS module 106. For differential pair signals, in some embodiments, the differential component of the output voltages of the output module 110 are scaled, or shifted, from the differential component of the input voltages at the input module 102. As mentioned previously, the shift can be based on the difference between the input common-mode and the integrated circuit common-mode. The output module 110 is communicatively coupled to the VLS module 106 and the rest of the IC. As mentioned previously, in some embodiments, the output module 110 includes the equalizer module 104.

Figure 2:
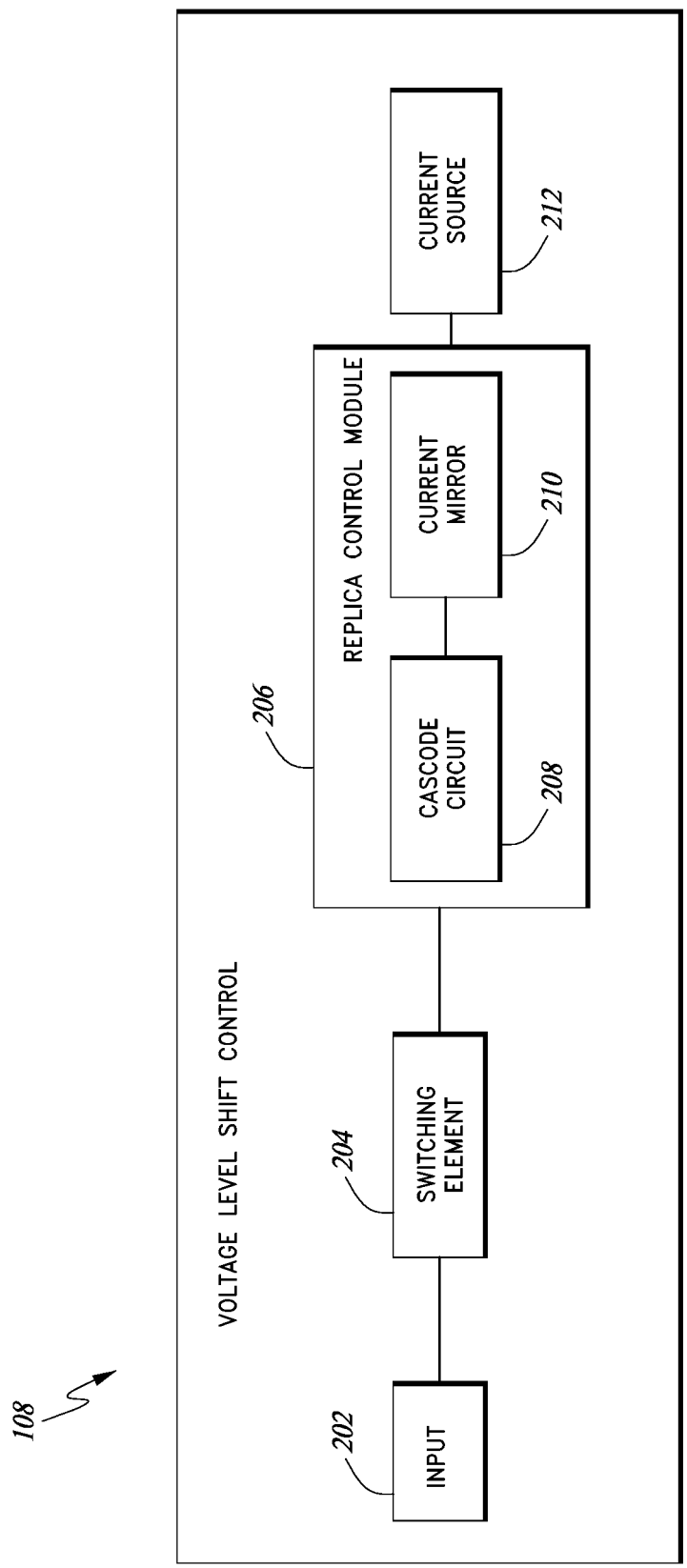
FIG. 2 is a block diagram of an embodiment of a voltage-level shift control module.

FIG. 2 is a block diagram of an embodiment of the VLS control module 108. In the illustrated embodiment, the VLS control module 108 includes a control input module 202, a switching element 204, a replica control module 206, and a current source 212. In the illustrated embodiment, the replica control module 206 further includes a cascode circuit 208 and a current mirror 210. In certain embodiments, the replica control module 206 includes an op-amp.

The control input module 202 receives the same single ended signal or differential signal as the input module 102, and can also include one or more control input resistors. In some embodiments, the control input resistors are significantly larger than the input resistors so that the majority of the current from the input passes through the input resistors and only a small fraction of the current passes through the control input resistors. In certain embodiments, the control input resistors can have a resistance that is approximately ten times or more the resistance of the input resistors. The difference between the common-mode voltage of the input signals and the quiescent voltage of the VLS control module 108 generates a servo current that passes through the switching element 204 and the replica control module 206.

The switching element 204 can be implemented using a transistor, such as a BJT, FET, such as a MOSFET, etc. In some embodiments, the switching element is a common base device or common gate device. The switching element 204 directs the servo current to the replica control module 206.

The replica control module 206 uses the servo current to control the current source 212 and current sources in the VLS module 106. In some embodiments, the replica control module 206 includes a cascode circuit 208 and a current mirror 210. In certain embodiments, the replica control module 206 is implemented using an op-amp.

The cascode circuit 208 can be implemented using one or more switching elements, such as BJTs, FETS, MOS devices, such as MOSFETS, and the like. In some embodiments, the cascode circuit 208 is a folded cascode circuit.

The current mirror 210 replicates a reference current as an output current, and can be implemented using one or more switching elements, such as BJTs, FETS, MOS devices, such as MOSFETS, and the like. In some embodiments, a first output of the cascode circuit 208 is used as the reference current for the current mirror 210. A second output of the cascode circuit is joined with the output of the current mirror to create an integrating node (Vbn, FIGS. 3A and 3C) responsive to the difference of the servo current and the reference current provided by the first output of the cascode circuit. The integrating node controls the current source 212 and one or more current sources within the VLS module 106, and enables the current source 212 to absorb the servo current.

Figure 3A:
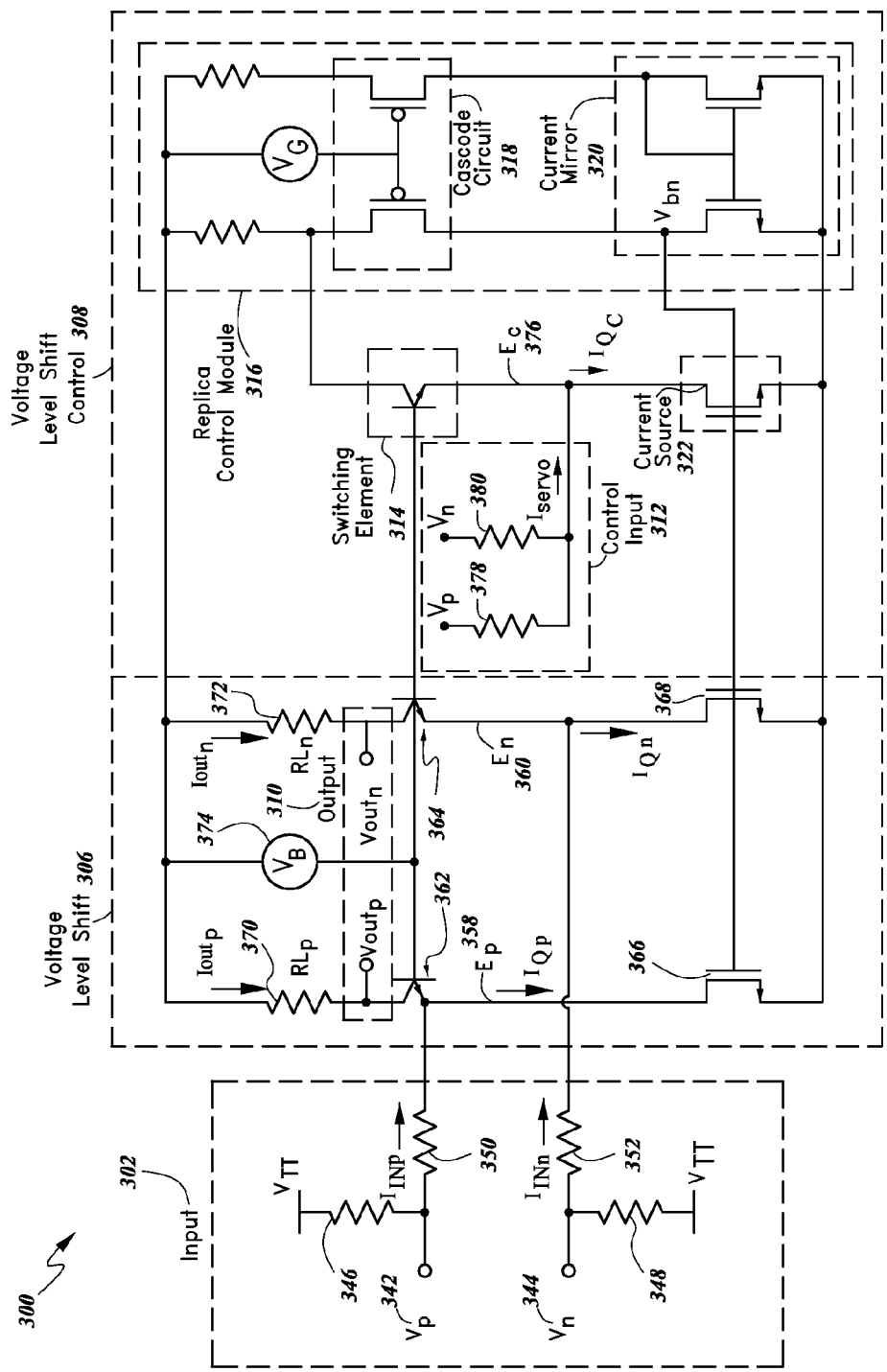
FIG. 3A is a circuit diagram of an embodiment of a receiver.

FIG. 3A is a circuit diagram of an embodiment of the receiver 300 including an input module 302, a voltage level shift module 306, a voltage level shift control module 308, and an output 310.

The input module 302 includes a differential pair of inputs Vp 342, Vn 344, termination resistors 346, 348 and input resistors 350, 352. As mentioned previously, the differential signals applied to the inputs Vp 342, Vn 344 generate input currents $I_{INp}$, $I_{INn}$ through the input resistors 350, 352, respectively.

In the illustrated embodiment, the VLS module 306 includes nodes Ep 358, En 360, switching elements 362, 364, current sources 366, 368, load resistors 370, 372, and a voltage bias 374. The switching elements 362, 364 are electrically coupled to the current sources 366, 368, respectively, (forming nodes Ep 358, En 360), load resistors 370, 372, respectively, and the voltage bias 374. The load resistors 370, 372 are also electrically coupled to a voltage source Vcc, while the current sources are also electrically coupled to a common voltage, which can be a common ground.

In some embodiments, the nodes Ep 358, En 360 are low impedance, which allows the circuit to support a higher capacitance load at the nodes Ep 358, En 360. Accordingly, larger devices can be used with improved matching, and larger range of level shift voltages can be achieved.

The switching elements 362, 364 and the current sources 366, 368 can be implemented using one or more transistors, such as BJTs, FETS, MOS devices, such as MOSFETS, etc. In some embodiments, the current sources 366, 368 can sink current to allow high input common-mode voltages. In certain embodiments, the current sources 366, 368 can become unbiased and turn off to allow low voltage input common-mode operation. The voltage bias 374 can be implemented using any number of electrical components, such as a voltage supply, resistor, etc., to bias the switching elements 362, 364 as desired, and as will be described in greater detail below with reference to FIG. 3C.

In addition, the current sources 366, 368 can be configured to create a virtual ground for common-mode signals at nodes Ep 358 and En 360, thereby effecting a voltage level shift and removing the input signal's common-mode content to transfer the input signal's differential content (via switch elements 362 and 364) to the internal $V_{CC}$ supply domain. A further advantage of establishing a virtual ground for common-mode input signal components at nodes Ep 358 and En 360 is that the magnitude of input common-mode current delivered to these nodes can be controlled by the magnitude of the input resistors 350, 352, thus facilitating design of the receiver circuit's quiescent bias levels. The low impedance at nodes 358, 360 presented by the common-base configuration comprising elements 362, 364, 366, 368 is additionally advantageous for differential mode operation in that the differential mode signal currents are substantially set by the value of the input resistors 350, 352 and the differential swing across the input nodes.

Figure 3B:
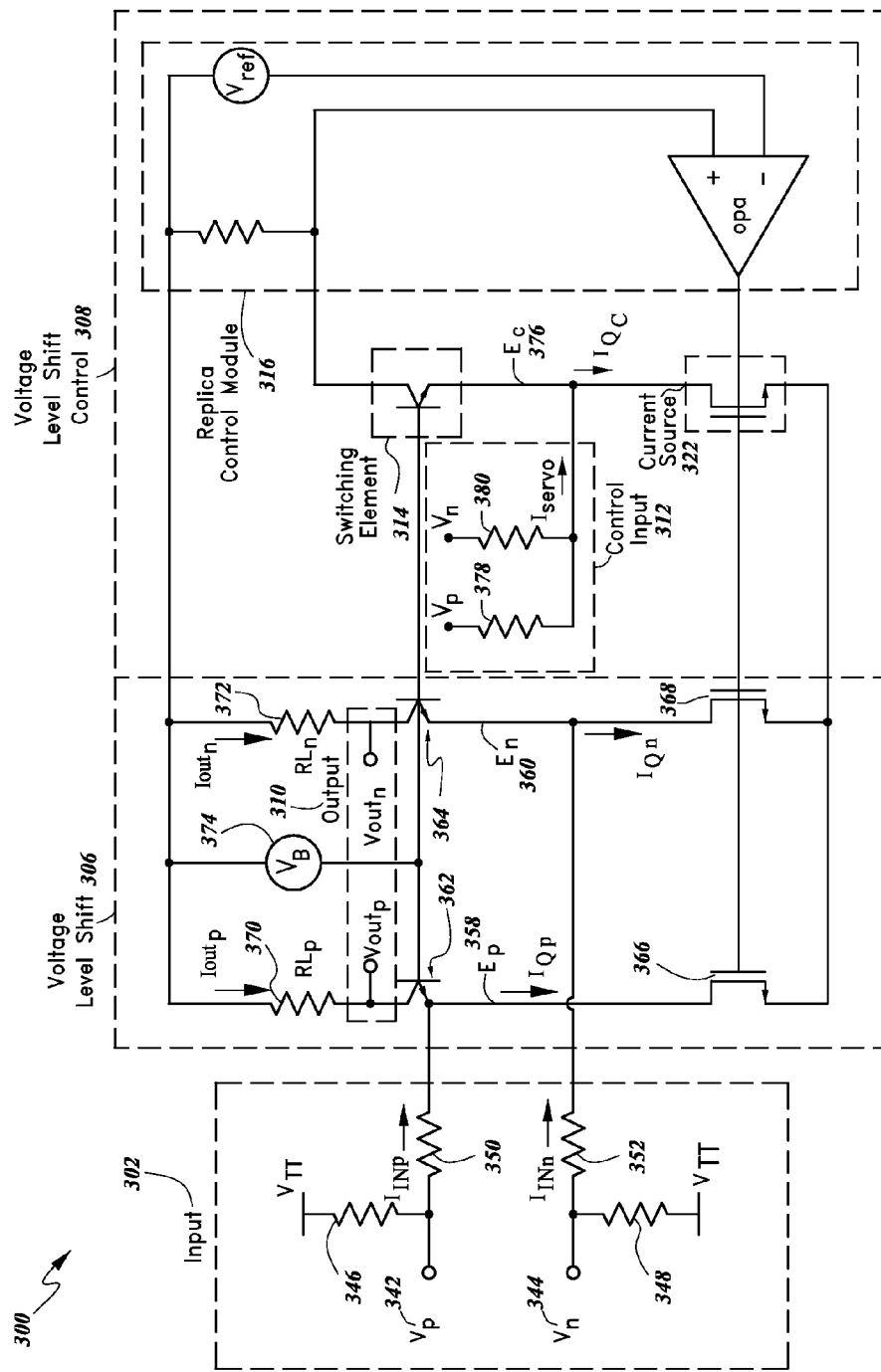
FIG. 3B is a circuit diagram of an embodiment of the receiver including an operational-amplifier.
Figure 3C:
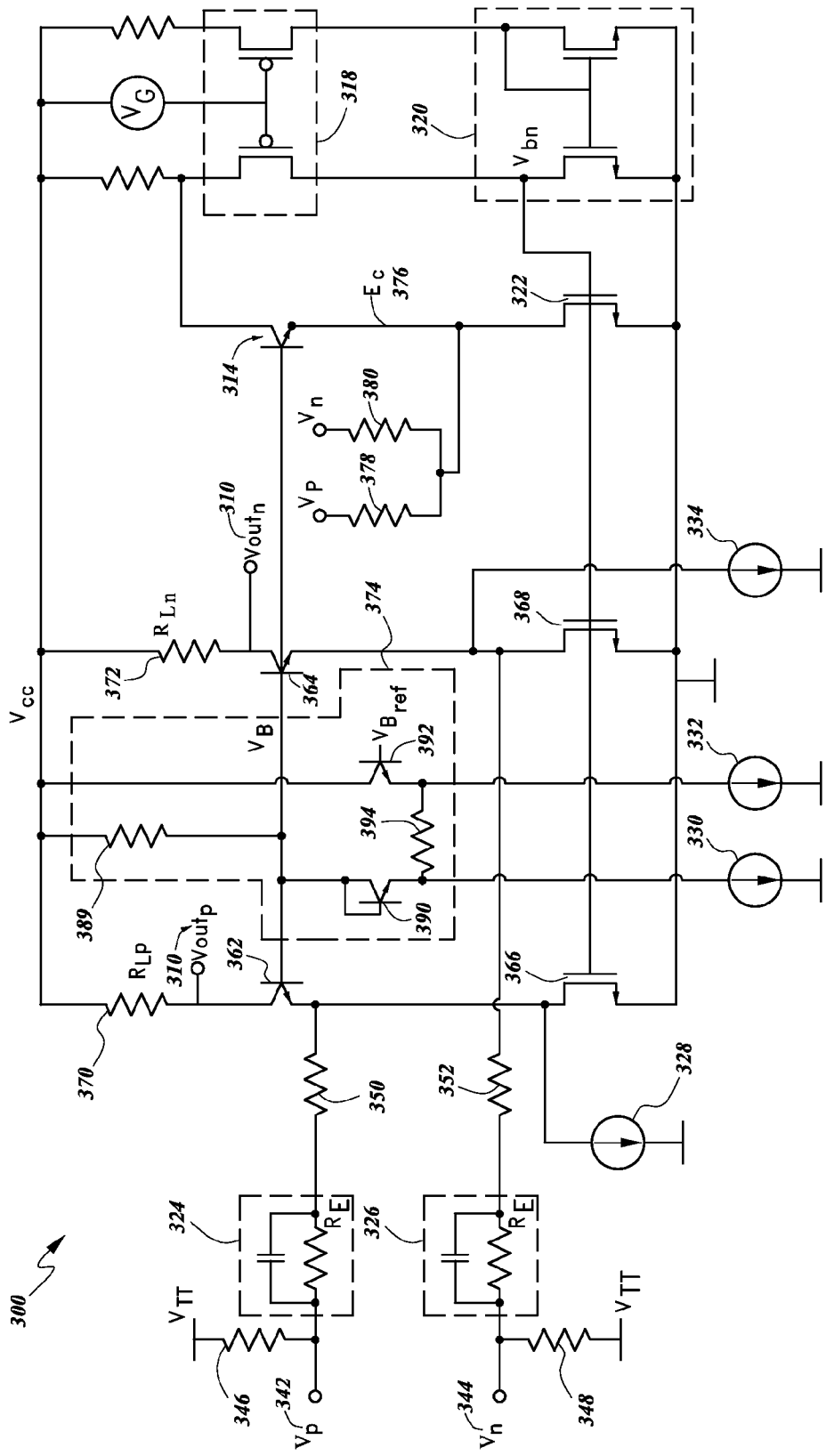
FIG. 3C is a circuit diagram of another embodiment of the receiver.

In some embodiments, the resistors 350, 352 can be replaced by a network with complex impedance, such as the equalizers 324,326 of FIG. 3C. In certain embodiments, the differential input signal is converted to a substantially current mode signaling convention, which can operate at higher frequencies with less sensitivity to parasitic loading than voltage mode signaling. Additionally, the current mode operation can accommodate a wider dynamic signal range at a specified linearity than a voltage mode operation.

Absent signals from the inputs Vp 342, Vn 344, and based on the configuration of the receiver 300, quiescent currents $I_{Qp}$, $I_{Qn}$ are "sourced" by the current sources 366, 368, respectively, and pass through the nodes Ep 358, En 360, respectively. In the context of this disclosure, "sourcing" current can refer to either sourcing or sinking current, and current "sources" refers to either current sources or current sinks. In other words, a current source can source positive current or negative current. Changes in voltage at the inputs Vp 342, Vn 344 alter the quiescent state of the nodes Ep 358, En 360 and lead to a change in the amount of current sourced by the current sources 366, 368, the amount current passing through the nodes Ep 358, En 360, and the amount of current passing through the load resistors 370, 372, as will be described in greater detail below.

In the illustrated embodiment, the VLS control module 308 includes a control input module 312, a switching element 314, and a replica control module 316, which includes a cascode circuit 318, a current mirror 320, and a current source 322. In some embodiments, the replica control module 316 can be implemented using an op-amp. The control input module 312 is electrically coupled to the switching element 314 and the current source 322, forming node Ec 376. The switching element 314 is electrically biased by the voltage bias 374, similar to the switching elements 362, 364, and is also electrically coupled to the cascode circuit 318. The cascode circuit 318 is electrically coupled to the current mirror 320, which in turn is electrically coupled to the current source 322.

In the illustrated embodiment, the control input module 312 includes the differential inputs Vp 342, Vn 344 and control input resistors 378, 380. As described previously, in some embodiments, the control input resistors 378, 380 have a significantly higher resistance than the input resistors 350, 352 so that only a relatively small portion of current enters the control input module 312.

The switching element 314 and current source 322 can be implemented using one or more transistors, such as BJTs, FETS, MOS devices, such as MOSFETS, etc. While various elements of the illustrated embodiment implemented with NPN bipolar transistors (362, 364, 314), PMOS transistors (318), and NMOS transistors (320, 322, 366, 368), in an alternative embodiment, the mirror image can be implemented such that current directions are reversed, positive voltages are turned to negative voltages and vice-versa, NPN transistors are swapped with PNP transistors and vice-versa, and PMOS transistors are swapped with NMOS transistors and vice-versa.

Furthermore, the physical size of the current source 322 can be selected based on a desired scale factor between the current source 322 and the current sources 366, 368. For example, if a scale factor of five is selected, the width of the current sources 366, 368 can be five times larger than the width of the current source 322. In this way, the same control signal from the current mirror 320 will result in five times more current being sourced through the current sources 366, 368 than the current source 322.

In the illustrated embodiment, the replica control module 316 is implemented using a cascode circuit 318 and a current mirror 320. The cascode circuit includes a first output that provides a reference current for the current mirror 320, and a second output that is joined with the output of the current mirror 320 to create an integrating node Vbn. The integrating node is responsive to the difference of the servo current (described in greater detail below) and the reference current provided by the first output of the cascode circuit 318. The integrating node Vbn also controls the current sources 322, 366, 368, and enables the current source 322 to absorb the servo current. Thus, as the servo current increases or decreases, the amount of current sourced at the current sources 322, 366, 368 will similarly increase or decrease.

The cascode circuit 318 and current mirror 320 can be implemented using one or more transistors, such as BJTs, FETS, MOS devices, such as MOSFETS, etc. In the illustrated embodiment, the cascode circuit 318 is implemented using two PMOS transistors in a folded cascode design. One skilled in the art will appreciate the multiplicity of designs that can be used to implement the cascode circuit 318. Similarly, although in the illustrated embodiment the current mirror 320 is implemented using two MOSFETS, one skilled in the art will appreciate the many alternative methods that can be used to implement the current mirror 320.

Similar to the input module 302, absent signals from the inputs Vp 342, Vn 344 and based on the configuration of the receiver 300, a quiescent current $I_{Qc}$ is sourced by the current source 322 onto the node Ec 376.

Changes in voltage at the inputs Vp 342, Vn 344 introduce a servo current, $I_{servo}$, to the node Ec 376 via the control input module 312. The current $I_{servo}$ is determined based on the difference between the common-mode voltage of the inputs Vp 342, Vn 344 and the quiescent voltage of the node Ec 376, and the control input resistors 378, 380. The current $I_{servo}$ passes through the switching element 314 and enters the replica control module 316. The replica control module 316 replicates the current $I_{servo}$ such that an increase in current observed at the control of the current source 322 is proportional to the current $I_{servo}$. The replica control module 316 directs the additional current $I_{servo}$ to the integrating node Vbn between the second cascode output and the current mirror output, causing an increase or decrease in gate voltage controlling current source 322 to force a change in current source's 322 current equal to $I_{servo}$.

An increased voltage at the gate of the current source 322 leads to an increase in current being sourced through the current source 322 so that the current $I_{servo}$ is absorbed through the current source 322. The increased voltage observed at the gate of the current source 322 is also observed at the gate of the current sources 366, 368. The increased voltage at the gate of current sources 366, 368 causes the current sources to source more current as well.

The additional current sourced through the current sources 366, 368 can be calculated as $k*I_{servo}$, where k represents the scale factor size between the current sources 366, 368 and the current source 322. The total current being sourced by the current source 366 can be represented as $I_{Qp}+k*I_{servo}$, and the total current being sourced by the current source 368 can be represented as $I_{Qn}+k*I_{servo}$.

Accordingly, the current ($I_{OUTp}$) passing through the load resistor 370 can be represented as $(I_{Qp}+k*I_{servo})-I_{INp}$ and $V_{OUTp}$ can be represented as $V_{CC}-I_{OUTp}*R_{Lp}$. Similarly, the current ($I_{OUTn}$) passing through load resistor 372 can be represented as $(I_{Qn}+k*I_{servo})-I_{INn}$ and the voltage at $V_{OUTn}$ can be represented as $V_{CC}-I_{OUTn}*R_{Ln}$. Thus, the differential inputs Vp 342, Vn 344 are voltage level shifted based on the $V_{CC}$ of the internal circuit to produce the differential output $V_{OUTp}$ and $V_{OUTn}$.

One skilled in the art will understand that a number of alternative elements can be used to implement the receiver 300. For example, a number of different transistors can be used to implement the switching elements, such as BJTs, FETS, MOS devices, such as MOSFETS, etc., or similar devices Similarly, the current sources, cascode circuit and current mirror can be implemented using a variety of transistors, such as BJTs, FETS, MOS devices, MOSFETS, etc., or similar devices. In some embodiments, an op-amp can be used for the replica control module 316 and can receive the current $I_{servo}$ at one input node and output a desired voltage to control the current sources 322, 366 and 368, as illustrated in FIG. 3B.

Furthermore, additional circuit elements can be added to the receiver 300 as desired. For example, FIG. 3C is a circuit diagram of an embodiment of the receiver 300 including the components described above with reference to FIG. 3A, as well as some additional components, including equalizers 324, 326, bias current sources 328, 330, 332, 334, and components of the voltage biasing circuit 374.

As discussed previously, the optional equalizers 324, 326 improve the signal quality of the incoming signals. In the illustrated embodiment, the equalizers 324, 326 are in series with the input resistors 350, 352, and each of the equalizers 324, 326 includes a capacitor 382, 384, respectively, in parallel with a resistor 386, 388, respectively. One skilled in the art will appreciate that a variety of topologies can be used to implement the equalizers. For example, the equalizers 324, 325 can be implemented using other passive circuits or active circuits as desired.

Further, when the input impedance is implemented as a high-pass network using the equalizers 324, 326, the range of possible values for the input resistors 350, 352 can be significantly smaller than in a voltage mode equivalent circuit. In some embodiments, the input resistors 350, 352 may be completely removed, allowing the spacing of the equalizers 324, 326 zero and pole frequencies to be determined by the device's intended operating regime, and the incremental resistance of the switching elements 362, 364 rather than input sensitivity limitations as in the voltage mode equivalent of a passive equalizer.

The current sources 328, 330, 332, 334 can provide additional bias for the switching elements 362, 364, 390, 392, can improve the speed of the receiver, and can help the receiver adapt to an even wider range of input common-mode. The current sources 328, 330, 332, 334 can be implemented using a variety of topologies, such as a voltage source in series with a resistor, common base devices, common gate devices, BJTs, FETS, MOS devices, etc. In some embodiments, the current sources 366, 368 can be configured to supply the bias currents in place of the bias current sources 328, and 334.

The voltage biasing circuit 374 can help generate the bias voltage of the switching elements 362, 364, and 314, and allow the receiver 300 to adjust to desired biasing conditions based on the voltage Vcc, which helps manage headroom on current source devices and available headroom at the output 310. In the illustrated embodiments, the voltage biasing circuit 374 includes a resistor 389, switching elements 390, 392 and a resistor 394. The switching element 392 is electrically connected to Vcc, a current source 332, and the resistor 394. A bias reference voltage $V_{Bref}$ controls the state of the switching element 392. The switching element 390 is electrically coupled to the voltage bias 374, the current source 330, and the resistor 394. One skilled in the art will appreciate that a variety of topologies can be used to implement the voltage biasing circuit 374.

Figure 4:
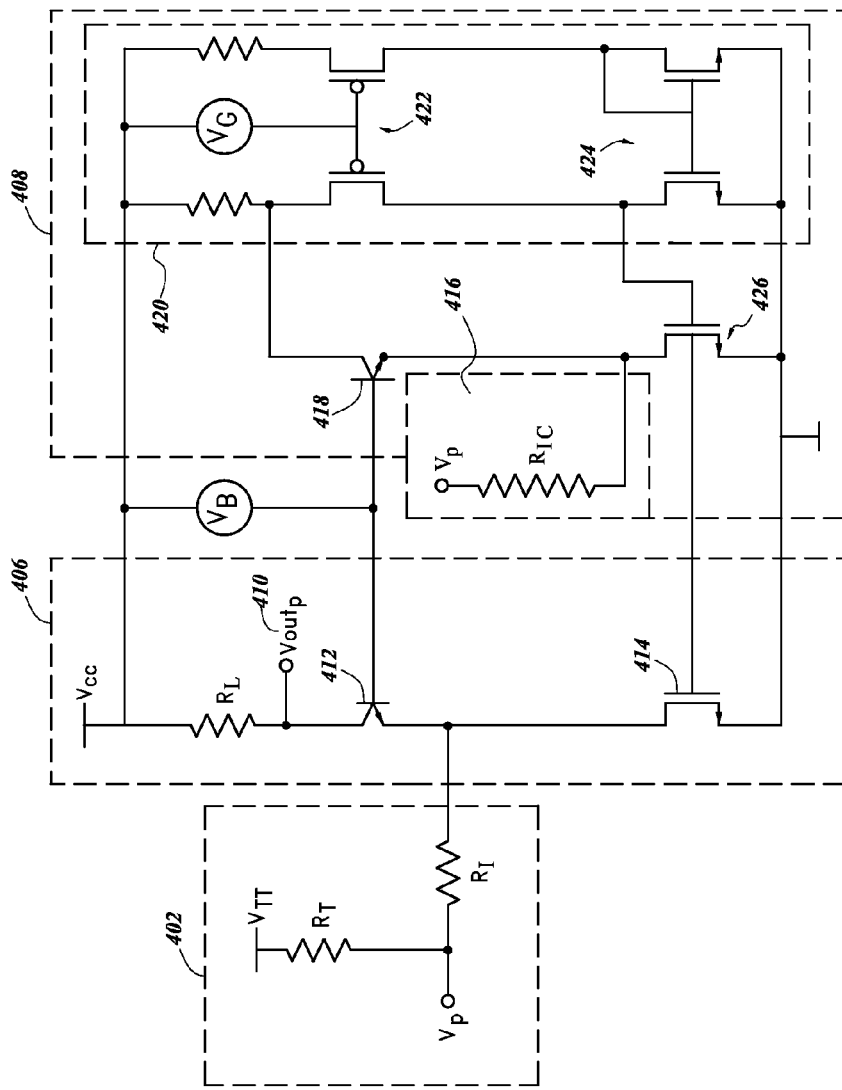
FIG. 4 is a circuit diagram illustrating an embodiment of a single-ended receiver.

FIG. 4 is a schematic diagram illustrating an embodiment of a receiver circuit 400 similar to the receiver circuit 300, but implemented as a single-ended receiver circuit. Similar to the receiver circuit 300, the receiver circuit 400 includes an input module 402, VLS module 406, a VLS control module 408, and an output 410. The various modules of the receiver circuit 400 include similar components as described above with reference to receiver circuit 300 of FIG. 3, except that the various modules are designed for a single input and single output.

For example, the input module 402 of FIG. 4 corresponds to the input module 302 of FIG. 3A. As described in greater detail with reference to the input module 302 of FIG. 3A, the input module 402 of FIG. 4 can include a voltage input (Vp), termination resistor ($R_T$), and an input resistor ($R_I$). In some embodiments, the input module 402 can also include an optional equalizer, as described in greater detail above with reference to the equalizers 324, 326 of FIG. 3A located between the termination resistor $R_T$ and the input resistor $R_I$.

Similarly, the VLS module 406 of FIG. 4 corresponds to the VLS module 306 of FIG. 3A. As described in greater detail above, with reference to the VLS module 306 of FIG. 3A, the VLS module 406 can include a load resistor ($R_L$), switching element 412 and current source 414.

Furthermore, the VLS control module 408 of FIG. 4 corresponds to the VLS control module 308 of FIG. 3A. Similar to the VLS control module 308 of FIG. 3A, the VLS control module 408 can include an input control module 416, switching element 418, and replica control module 420. As described in greater detail above, in some embodiments, the replica control module 420 can include a cascade circuit 422, current mirror 424, and current source 426. In certain embodiments, the replica control module 420 can include an op-amp.

The single-ended receiver 400 can also be implemented using the differential pair receiver 300 topology and by tying one of the inputs Vp 342, Vn 344 to a reference voltage, such as a voltage between $V_{TT}$ and ground or Vcc and ground, and receiving the input signal on the other input.

A skilled artisan will appreciate that the configurations and principles of the embodiments can be adapted for any electronic system. The circuits employing the above described configurations can be implemented into various electronic devices or integrated circuits. Examples of the electronic devices can include, but are not limited to, consumer electronic products, parts of the consumer electronic products, electronic test equipments, etc. Further, the electronic device can include unfinished products. Furthermore, the various topologies, configurations and embodiments described above may be implemented discretely or integrated on a chip without departing from the spirit and scope of the description.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this disclosure has been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

What is claimed is:

1. A common-mode receiver comprising:
   an input circuit configured to receive a first input signal and a second input signal, wherein the first and second input signals are associated with a first common-mode voltage;
   a voltage level shift circuit operatively coupled to the input circuit and comprising:
     a first current source operatively coupled to a first output of the input circuit, wherein the first current source is controlled by a control signal, and
     a second current source operatively coupled to a second output of the input circuit, wherein the second current source is controlled by the control signal; and
   a control circuit operatively coupled to the voltage level shift circuit, and configured to receive the first common-mode voltage and generate the control signal based at least in part on a magnitude of a current induced by a difference between the first common-mode voltage and a reference common-mode level,
   wherein the voltage level shift circuit is configured to:
     shift a voltage level of the first input signal and the second input signal based at least in part on the control signal, wherein the voltage level is shifted in proportion to the magnitude of the current induced by the difference between the first common-mode voltage and the reference common-mode level, and
     output a first output signal based at least in part on the shifted voltage level of the first input signal and a second output signal based at least in part on the shifted voltage level of the second input signal, wherein the first and second output signals are associated with an output common-mode level.

2. The common-mode receiver of claim 1, further comprising:
   a first node formed between a first switching element of the voltage level shift circuit and the first current source; and
   a second node formed between a second switching element and the second current source, wherein the first node and the second node form a virtual ground with respect to the first common-mode voltage.

3. The common-mode receiver of claim 2, wherein the first node is operatively coupled to an emitter of a BJT of the first switching element and a drain of a FET of the first current source.

4. The common-mode receiver of claim 3, wherein the second node is operatively coupled to an emitter of a BJT of the second switching element and a drain of a FET of the second current source.

5. The common-mode receiver of claim 4, further comprising a third node operatively coupled to a base of a BJT of the first switching element, a base of a BJT of the second switching element, and a base of a BJT of one or more control switching elements of the control circuit.

6. The common-mode receiver of claim 1, wherein the control circuit comprises:
   a cascode circuit,
   a current mirror operatively coupled to the cascode circuit, and
   a control current source operatively coupled to the current mirror, the first current source, and the second current source,
   wherein an output of the current mirror and an output of the cascade circuit provide the control signal to the control current source, the first current source, and the second current source.

7. The common-mode receiver of claim 6, wherein an input to the control circuit provides a current to the cascode circuit.

8. The common-mode receiver of claim 6, further comprising a first control node operatively coupled to an emitter of a BJT of one or more control switching elements of the control circuit and a drain of a FET of the control current source.

9. The common-mode receiver of claim 8, further comprising a second control node operatively coupled to a collector of a BJT of the one or more control switching elements and the source a source of a FET of the cascode circuit.

10. The common-mode receiver of claim 6, wherein the cascode circuit comprises one or more FETS and the current mirror comprises one or more FETS.

11. The common-mode receiver of claim 6, wherein a third node is coupled to a drain of a FET of the cascode circuit, a drain of a FET of the current mirror and a gate of a FET of each of the first current source, the second current source, and the control current source.

12. The common-mode receiver of claim 1, wherein an input to the control circuit comprises a higher impedance than an input to the input circuit.

13. The common-mode receiver of claim 1, wherein a differential component of the first and second output signals is scaled from a differential component of the first and second input signals.

14. A common-mode receiver comprising:
an input circuit configured to receive at least a first input signal and a second input signal;
a voltage level shift circuit operatively coupled to the input circuit and configured to apply a level shift to the first input signal and the second input signal and generate a first output signal that is level shifted from the first input signal and a second output signal that is level shifted from the second input signal based at least in part on a control signal, wherein a magnitude of the level shift varies in relation to a current induced by a difference between a common-mode voltage of the first input signal and the second input signal and a reference common-mode level; and
a voltage level shift control circuit operatively coupled to the voltage level shift circuit and configured to:
receive the first input signal and the second input signal, and
generate the control signal based at least in part on a magnitude of the current induced by the difference between the common-mode voltage and the reference common-mode level.

15. The common-mode receiver of claim 14, wherein the voltage level shift circuit comprises:
a first current source configured to control a first current through the voltage level shift circuit based at least in part on the control signal, and
a second current source configured to control a second current through the voltage level shift circuit based at least in part on the control signal.

16. The common-mode receiver of claim 15, wherein the voltage level shift control circuit comprises a cascode circuit and a current mirror.

17. The common-mode receiver of claim 16, wherein the voltage level shift control circuit comprises a control current source configured to receive the control signal, and wherein the control signal for the control current source, the first current source, and the second current source corresponds to an output of the current mirror and an output of the cascode circuit.

18. The common-mode receiver of claim 14, wherein voltage level shift control circuit comprises a control current source configured to receive the control signal and sink the current induced by the difference between the common-mode voltage and the reference common-mode level based at least in part on the received control signal.

19. A method for performing a voltage-level shift at a common-mode receiver, the method comprising:
receiving a first input signal and a second input signal at an input circuit, wherein the first input signal and the second input signal are associated with a first common-mode voltage;
receiving the first input signal and the second input signal at a control circuit; generating a control signal at the control circuit based at least in part on a magnitude of a current induced by a difference between the first common-mode voltage and a reference common-mode level;
receiving the control signal at a voltage level shift circuit; and
applying, at the voltage level shift circuit and based at least in part on the control signal, a voltage level shift to the first input signal and the second input signal to generate a first output signal that corresponds to the first input signal and a second output signal that corresponds to the second input signal, wherein a magnitude of the voltage level shift varies in relation to the magnitude of the current induced by the difference between the first common-mode voltage and the reference common-mode level, wherein the first output signal and the second output signal are associated with a second common-mode voltage.

20. The method of claim 19, wherein receiving the control signal at the voltage level shift circuit comprises:
receiving the control signal at a first current source and a second current source of the voltage level shift circuit;
controlling a first current through the voltage level shift circuit based at least in part on the control signal received at the first current source; and
controlling a second current through the voltage level shift circuit based at least in part on the control signal received at the second current source.

\* \* \* \* \*

UNITED STATES PATENT AND TRADEMARK OFFICE
CERTIFICATE OF CORRECTION

PATENT NO.        : 9,467,310 B2                                Page 1 of 1
APPLICATION NO.   : 13/457213
DATED             : October 11, 2016
INVENTOR(S)       : Jesse Bankman It is certified that error appears in the above-identified patent and that said Letters Patent is hereby corrected as shown below:

In the Claims

In Column 11 at Line 12 (approx.), In Claim 9, after "and" delete "the source".

In Column 12 at Line 42 (approx.), In Claim 19, after "level," insert --and--.

Signed and Sealed this
Seventh Day of February, 2017

Michelle K. Lee
*Director of the United States Patent and Trademark Office*